United States Patent [19]
Lin

[11] Patent Number: 5,725,912
[45] Date of Patent: Mar. 10, 1998

[54] METHOD OF MANUFACTURING AN ELECTRIC HEATING FILM OF SEMICONDUCTOR

[76] Inventor: Pan-Tien Lin, P.O. Box 82-144, Taipei, Taiwan

[21] Appl. No.: 493,589

[22] Filed: Jun. 22, 1995

Related U.S. Application Data

[63] Continuation-in-part of Ser. No. 155,754, Nov. 22, 1993, abandoned.

[51] Int. Cl.$^6$ ................................................. C23C 14/12
[52] U.S. Cl. .................... 427/525; 427/58; 427/314; 427/427; 437/225
[58] Field of Search ................................. 427/576, 427, 427/314, 126.3, 58, 525; 437/225

[56] References Cited

U.S. PATENT DOCUMENTS

| | | | |
|---|---|---|---|
| 2,564,709 | 8/1951 | Mochel | 201/73 |
| 3,108,019 | 10/1963 | Davis | 117/201 |
| 4,889,974 | 12/1989 | Auding et al. | 219/543 |

*Primary Examiner*—Bernard Pianalto
*Attorney, Agent, or Firm*—A & J

[57] ABSTRACT

A method of manufacturing an electric heating film of semiconductor including steps of fusing together halides of indium or tin or their organic compound and adding 1–10% of impurities of halides of antimony or iron, hydrogen fluoric acid, or ammonium fluoride in weight, mixing and stirring well the materials with a medium material at a proportion of 20–60% in weight, and cleaning a base material with clean soft water and drying the surface thereof, and disposing the base material into a heating furnace for activating its surface, mixing the liquid material with air and spraying it into the heating furnace thereby atomizing and dissolving the liquid material into ions, and letting the ions be accumulated and evenly coated on the surface of the base material or directly spraying the liquid material on the activated surface of the base material thereby forming an electric heating film of semiconductor on the base material.

6 Claims, 5 Drawing Sheets

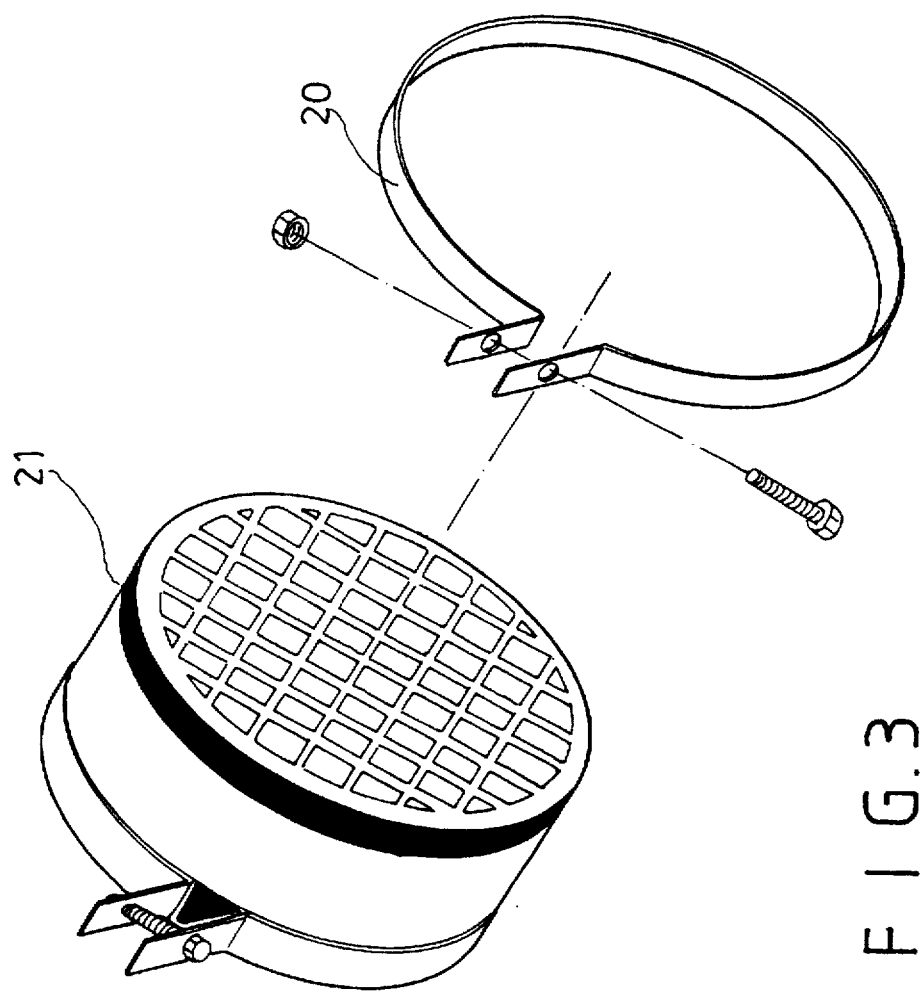
F I G. 3

METHOD OF MANUFACTURING AN ELECTRIC HEATING FILM OF SEMICONDUCTOR

CROSS-REFERENCE

This application is a continuation-in-part of the patent application Ser. No. 08/155,754, filed Nov. 22, 1993, now abandoned.

BACKGROUND OF THE INVENTION

It has been found that the conventional way to change electric energy into heat is simply achieved by passing electric current through an electric heater wound with resistance wires or a P.T.C. Nevertheless, the resistance wire is expensive and difficult to wind on the heater thereby increasing the cost of the electric heater. Further, such an electric heater will burn with flames in use hence wasting a lot of electric energy and consuming much oxygen. Furthermore, the electric heater will be oxidized and become useless after having used for a certain period of time. In addition, the shape of the electric heater is confined to a small one with regular surface.

Therefore, it is an object of the present invention to provide a method of manufacturing an electric heating film which can obviate and mitigate the above-mentioned drawbacks.

SUMMARY OF THE INVENTION

This invention relates to a method of manufacturing an improved electric heating film.

It is the primary object of the present invention to provide a method of manufacturing an electric heating film of semiconductor which can spray an electric heating film on a base material.

It is another object of the present invention to provide a method of manufacturing an electric heating film of semiconductor which is especially useful when it is required to coat an electric heating film on a base material with irregular surfaces.

It is still another object of the present invention to provide a method of manufacturing an electric heating film of semiconductor which is relatively low in cost.

It is still another object of the present invention to provide a method of manufacturing an electric heating film of semiconductor which has a heat efficiency of more than 90%.

It is still another object of the present invention to provide a method of manufacturing an electric heating film of semiconductor of which the thickness and/or proportion of the constituents can modified in accordance with the required power output.

It is still another object of the present invention to provide a method of manufacturing an electric heating film of semi-conductor which is economical to carry out.

It is still another object of the present invention to provide a method of manufacturing an electric heating film of semi-conductor which is durable in use.

It is a further object of the present invention to provide a method of manufacturing an electric heating film of semi-conductor which will be rapidly cooled when the power supply is switched off thereby preventing accidents.

The invention accordingly consists of features of constructions and method, combination of elements, arrangement of parts and steps of the method which will be exemplified in the constructions and method hereinafter disclosed, the scope of the application of which will be indicated in the claim following.

BRIEF DESCRIPTION OF THE DRAWINGS

FIG. 3 shows a beehive-shaped product coated with the present invention;

DETAILED DESCRIPTION OF THE PREFERRED EMBODIMENT

Figure 1:
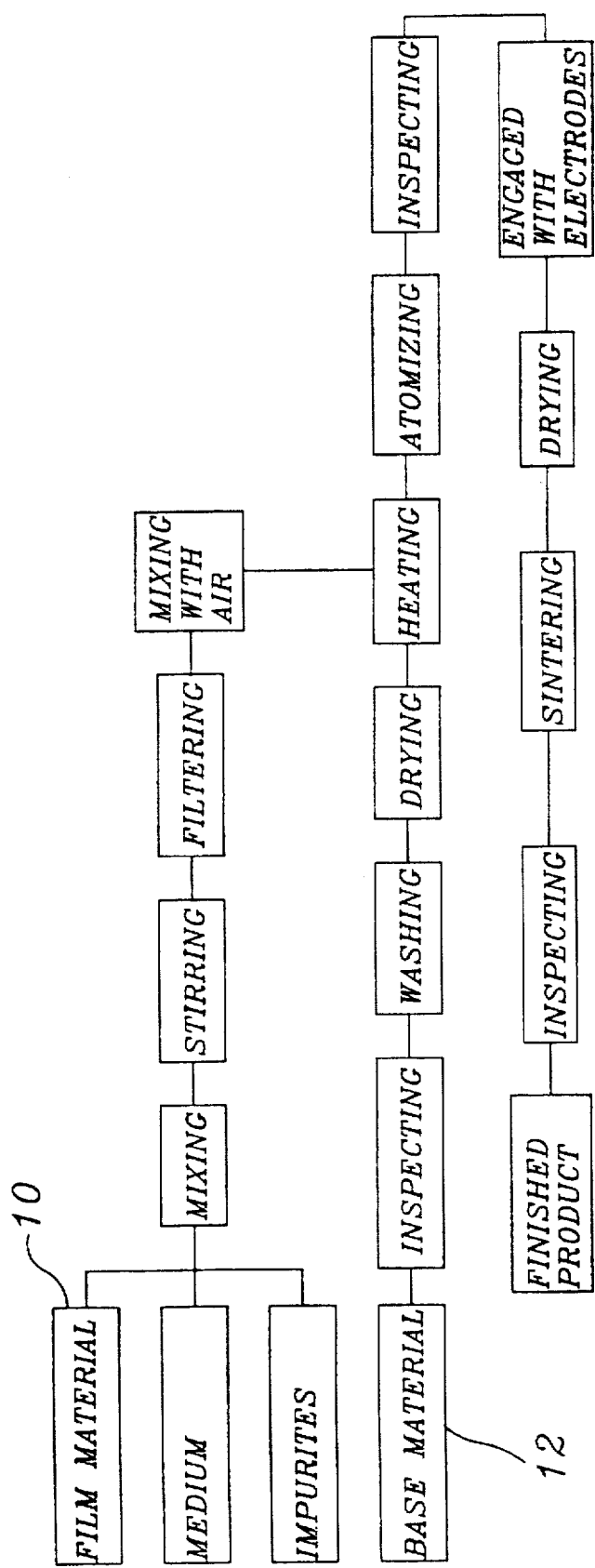
FIG. 1 is a manufacturing flow chart of the present invention.

Before explaining the present invention in detail, it is to be understood that the invention is not limited in its application to the details of construction and arrangement of parts illustrated in the accompanying drawings, since the invention is capable of other embodiments and of being practiced or carried out in various ways. Also it is to be understood that the phraseology or terminology employed herein is for the purpose of description and not of limitation.

The method of manufacturing an electric heating film of mainly comprises steps of material preparation, material mixing, base material cleaning, and high temperature atomizing which will be described in detail as follows:

Material Preparation: fusing together halides of indium or tin, or their organic compound and adding 1–10% of impurities of halites of antimony or iron, hydrofluoric acid, or ammonium fluoride in weight. Tin compound is the easiest to obtain and lowest in cost and so it is preferred to be used as the main material. As we all know, oxides are non-conductive substances and will become semiconductor when incorporated of certain impurities. In this preferred embodiment, 1–10% of impurities in weight is added into the oxides which is being fused with the medium material so as to modify the resistivity thereby controlling the heat evolved from the mixture.

Material mixing: mixing and stirring well the materials with a medium substance at a proportion of 20–60% in weight. The medium substance may be water, methyl alcohol, ethyl alcohol, hydrochloric acid, ethylamine . . . etc. The material and the medium substance are stirred well to form a liquid material which is then filtered so as to remove the undesired matter therein.

Base material cleaning: cleaning a base material 12 with clean soft water and drying the surface thereof. The material may be in the shape of a tube, a panel, or a beehive 21 shown in FIG. 3. In addition, the base material 12 may be conveniently made of quartz, glass, porcelain, mica or similar material with high temperature resistance and low expansion coefficient. Moreover, the base material 12 must be inspected, washed with clean soft water and dilute hydrochloric acid, and dried before use.

High temperature atomizing: disposing the base material 12 into a heating furnace (not shown) for heating to 400–800 degrees centigrade for 5–10 minutes so as to activate its surface, mixing the liquid material with air at a certain proportion and spraying it into the heating furnace by means of a compressor at an air pressure of 2.0 kg/cm³ thereby atomizing and dissolving the liquid material into ions, and letting the ions be accumulated and evenly coated on the surface of the base material to a thickness of 3–300μ or directly spraying the liquid material on the activated surface of the base material thereby forming an electric heating film of semiconductor on the base material. Then, the base material 12 in the shape of a beehive is coated with a layer of silver glue 21 with a temperature resistance of higher than 850 degrees centigrade and a resistance lesser than 0.3 ohm.

The general time for atomizing the liquid material is about 10–30 minutes and depends on the thickness of the film designed to be coated on the base material and the power of the heating furnace. As the electric heating film coated on the base material 12 is very thin, the electric current consumed is very small and the heat energy is transmitted from inside to outside, the temperature difference between the inside and outside will be small and it is unnecessary to worry about explosion. According to the experimental results, the temperature evolved from the electric heating film can reach 700 degrees centigrade. Further, no obvious flame will be produced when the temperature is lower than 500 degrees centigrade. In addition, the electric heating will consume less than 70 per cent of electricity required by the prior art.

Figure 2:
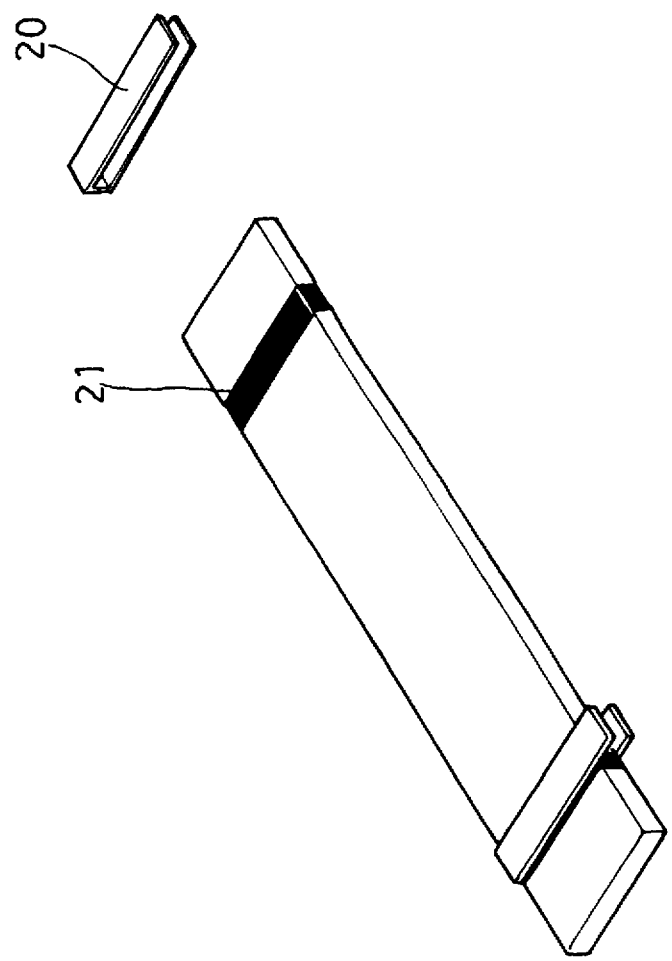
FIG. 2 shows a rectangular product coated with the present invention.
Figure 4:
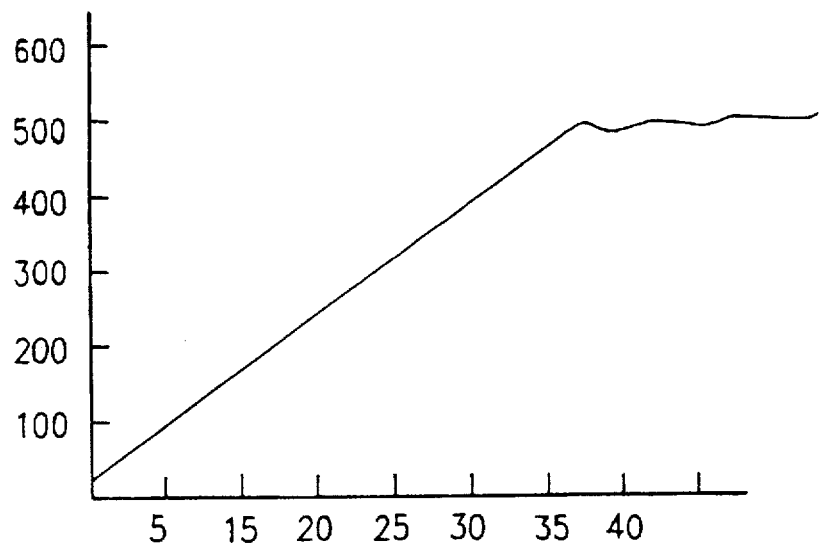
FIG. 4 illustrates the temperature gradient of the present invention.
Figure 5:
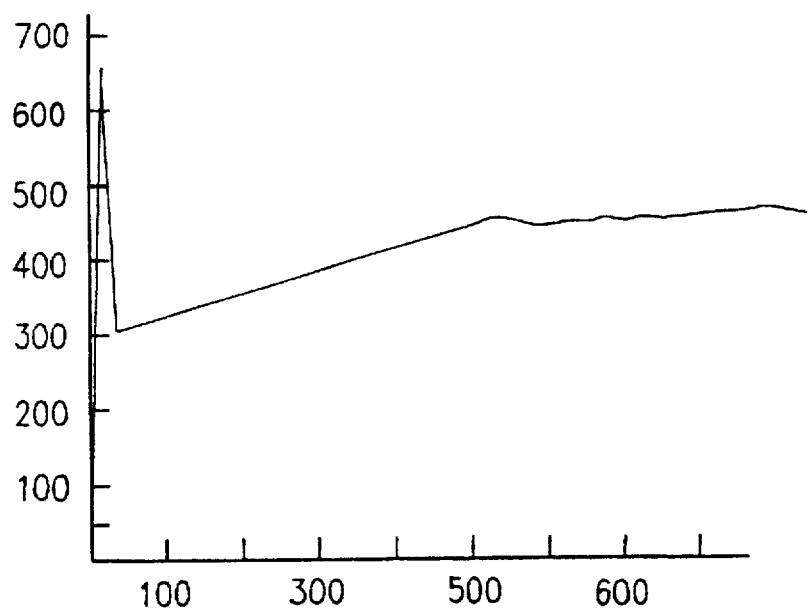
FIG. 5 illustrates the relationship between the power and the temperature.

Now, a preferred embodiment of the present invention is described as follows:

At first, mix 100 g of tin halide (or indium halide), 2 g of antimony halite, 10 c.c. of hydrochloric acid, and 50 c.c. water together and stir them well to prepare a liquid material. The proportion of the constituents of the liquid material may be modified as per the temperature required to be obtained. According to the experimental result, electric heating film has a property of 20–30 ohms/□ and has both the high temperature characteristic of the resistance filament and the property of the P.T.C. The characteristics of the electric heating film are shown in FIGS. 4 and 5. When in use, it is only necessary to mount two electrodes 20 on the present invention (see FIGS. 2 and 3).

EXAMPLE 1

$SnCl_2 + H_2O \rightarrow SnO + 2HCl$
$2SnO + O_2 \rightarrow 2SnO_2$
$2SnO \rightarrow Sn + SnO_2$ Sb will be released from the antimony halide at high temperature. Thus, an semi-conductor of $SnO_2$:Sb will be obtained.

EXAMPLE 2

| | |
|---|---|
| $Bu_2SnX_2$ | 30 g |
| $NH_4F$ | 40 g |
| $H_2O$ | 70 g |
| $CH_3OH$ | 50 g |

$Bu_2SnX_2 \xrightarrow[H_2O]{CH_3OH} BuSn^{+2} + 2X^-$ $BuSn^{+2} + O_2 \xrightarrow{\Delta 400-800°C.} SnO_2 + CO_2 + H_2O$ $(C_4H_9)Sn^{+2} + 27O_2 \xrightarrow{\Delta 400-800°C.} SnO_2 + 8CO_2 + 9H_2O$ The organic compound is characterized in the transparency thus making it especially suitable for use with the windshield.

Figure 6:
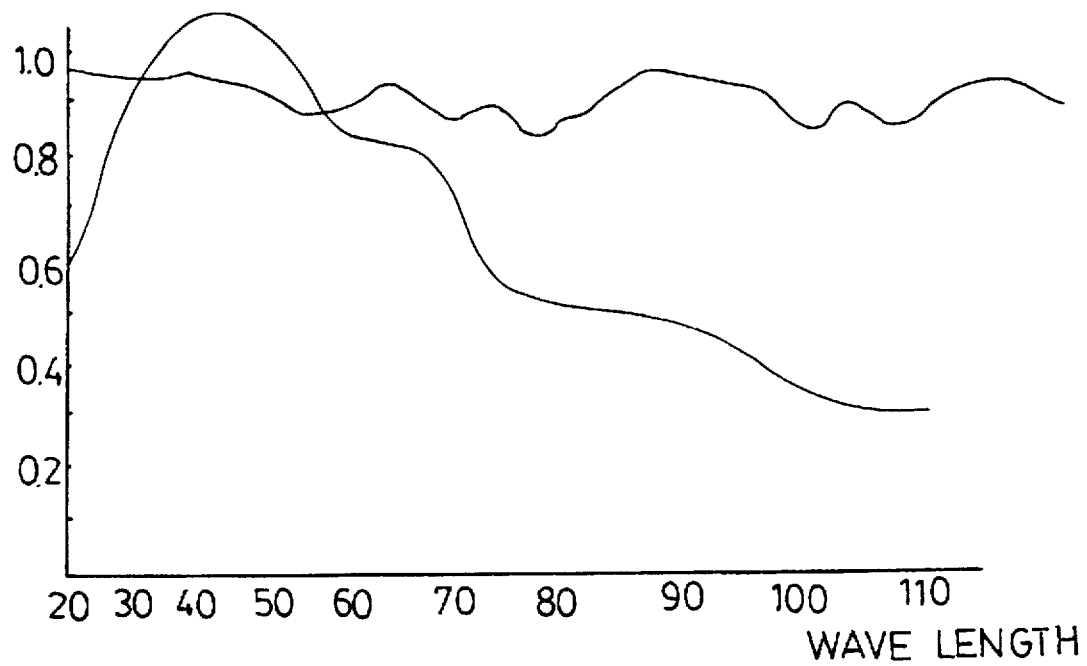
FIG. 6 illustrates the relationship between the refractive index and the wave length.

Looking now at FIG. 3, the temperature of the electric heating film will soar to 500 degrees centigrade in 30 seconds. FIG. 5 illustrates the relationship between the power and the temperature of the present invention. The power consumption of the present invention is much lower than that required by the prior art. FIG. 6 shows the relationship between the refractive index and the wave length of the present invention. As shown, the heat energy of the present invention includes far infrared energy and radiating energy and 80% of the heat energy comes from the far infrared energy.

The invention is naturally not limited in any sense to the particular features specified in the forgoing or to the details of the particular embodiment which has been chosen in order to illustrate the invention. Consideration can be given to all kinds of variants of the particular embodiment which has been described by way of example and of its constituent elements without thereby departing from the scope of the invention. This invention accordingly includes all the means constituting technical equivalents of the means described as well as their combinations.

I claim:

1. A method of manufacturing an electric heating film of a semiconductor on a substrate comprising the steps of:

fusing a halide of indium and a halide of tin together by heating;

adding 1–10% of hydrofluoric acid in weight;

mixing said halide and said acid with a medium material at a proportion of 20–60% in weight to form a liquid material;

cleaning a substrate with clean soft water and drying the surface thereof; and disposing said substrate into a heating furnace wherein said substrate is heated to 400°–800° C. for 10–30 minutes to activate its surface, spraying said liquid material mixed with air into said heating furnace thereby atomizing and dissolving said liquid material into ions, and letting said ions be accumulated evenly coating the surface of said substrate or directly spraying said liquid material on the activated surface of said substrate thereby forming an electric heating film of semiconductor on said substrate.

2. The method of manufacturing an electric heating film of semiconductor as claimed in claim 1, wherein said medium material is water.

3. The method of manufacturing an electric heating film of semiconductor as claimed in claim 1, wherein said medium material is methyl alcohol.

4. The method of manufacturing an electric heating film of semiconductor as claimed in claim 1, wherein said medium material is ethyl alcohol.

5. The method of manufacturing an electric heating film of semiconductor as claimed in claim 1, wherein said medium material is ethylamine.

6. The method of manufacturing an electric heating film of semiconductor as claimed in claim 1, wherein said electric heating film has a thickness of 3–300μ.

* * * * *